United States Patent
Kwok et al.

(10) Patent No.: US 7,002,348 B2
(45) Date of Patent: Feb. 21, 2006

(54) CRYOGENICALLY COOLED PHASED ARRAY RF RECEIVER COIL FOR MAGNETIC RESONANCE IMAGING

(75) Inventors: Wingchi Edmund Kwok, Rochester, NY (US); Zhigang You, Rochester, NY (US); Jianhui Zhong, Pittsford, NY (US)

(73) Assignee: University of Rochester, Rochester, NY (US)

(*) Notice: Subject to any disclaimer, the term of this patent is extended or adjusted under 35 U.S.C. 154(b) by 0 days.

(21) Appl. No.: 10/939,419

(22) Filed: Sep. 14, 2004

(65) Prior Publication Data

US 2005/0030032 A1   Feb. 10, 2005

Related U.S. Application Data

(62) Division of application No. 10/405,633, filed on Apr. 3, 2003, now Pat. No. 6,825,664.

(60) Provisional application No. 60/369,854, filed on Apr. 5, 2002.

(51) Int. Cl.
   *G01V 3/00* (2006.01)
(52) U.S. Cl. ..................... 324/322; 324/318
(58) Field of Classification Search ............... 324/322, 324/318, 300, 312, 314; 600/421, 422
   See application file for complete search history.

(56) References Cited

U.S. PATENT DOCUMENTS

| | | | |
|---|---|---|---|
| 4,408,162 A | 10/1983 | Egger | 324/318 |
| 4,691,164 A * | 9/1987 | Haragashira | 324/322 |
| 4,739,271 A | 4/1988 | Haase | 324/322 |
| 4,743,880 A | 5/1988 | Breneman et al. | 335/301 |
| 4,763,076 A | 8/1988 | Arakawa et al. | 324/322 |
| 4,788,503 A * | 11/1988 | Van Heelsbergen | 324/322 |
| 4,816,962 A | 3/1989 | Yamada et al. | 361/141 |
| 4,855,680 A | 8/1989 | Arakawa et al. | 324/314 |
| 4,978,920 A | 12/1990 | Mansfield et al. | 324/318 |
| 5,130,686 A | 7/1992 | Leupold | 335/216 |
| 5,144,244 A | 9/1992 | Kess | 324/322 |
| 5,276,399 A | 1/1994 | Kasten et al. | 324/319 |
| 5,399,970 A | 3/1995 | Pelc et al. | 324/309 |
| 5,548,218 A | 8/1996 | Lu | 324/318 |
| 5,563,566 A | 10/1996 | Laskaris et al. | 335/216 |
| 5,659,281 A | 8/1997 | Pissanetzky et al. | 335/296 |
| 5,903,150 A | 5/1999 | Roznitsky | 324/318 |
| 6,014,069 A | 1/2000 | Havens et al. | 335/216 |
| 6,100,780 A | 8/2000 | Dorri et al. | 335/216 |
| 6,160,400 A * | 12/2000 | Friedrich et al. | 324/322 |
| 6,177,795 B1 | 1/2001 | Zhu et al. | 324/307 |
| 6,201,392 B1 | 3/2001 | Anderson et al. | 324/300 |
| 6,326,789 B1 | 12/2001 | Yoshida et al. | 324/318 |
| 6,348,794 B1 | 2/2002 | Nabetani et al. | 324/318 |
| 6,459,265 B1 * | 10/2002 | Lou et al. | 324/322 |
| 6,747,452 B1 * | 6/2004 | Jectic et al. | 324/311 |

* cited by examiner

*Primary Examiner*—Louis Arana
(74) *Attorney, Agent, or Firm*—Blank Rome LLP

(57) ABSTRACT

An RF coil construction for MRI is disclosed. The construction includes a device for cryogenically cooling receiver coils, at least two coil elements being cryogenically cooled by the device and forming an array. Each coil element includes at least two capacitors for tuning and matching the coil element. The construction also includes a circuit connected to each coil element for decoupling the coil element from the transmitter coil(s), and also for decoupling among coil elements.

7 Claims, 3 Drawing Sheets

CRYOGENICALLY COOLED PHASED ARRAY RF RECEIVER COIL FOR MAGNETIC RESONANCE IMAGING

This application is a divisional of U.S. patent application Ser. No. 10/405,633, filed Apr. 3, 2003, now U.S. Pat. No. 6,825,664, which claims the benefit of U.S. Provisional Application No. 60/369,854 filed Apr. 5, 2002.

BACKGROUND OF THE INVENTION

Magnetic Resonance Imaging ("MRI") systems are well known in the art and widely used in medicine. These systems typically include a magnet system for generating a steady magnetic field, a magnet system for generating gradient fields, and an RF transmitter coil for generating an RF field which excites nuclei in a patient for magnetic resonance. The magnetic resonance signal is detected by the RF transmitter coil or by a special RF receiver coil or coils.

Three important parameters to evaluate an RF receive coil are signal-to-noise ratio (SNR), homogeneity, and field-of-view ("FOV") coverage. The SNR may be defined as the ratio between the signal strength on the image and the background noise. An RF coil typically achieves a higher SNR when it is closer to the part of the patient being imaged.

The homogeneity measures signal sensitivity variation in the RF coil. The receiving sensitivity of the RF receiver coil generally decreases with increasing distance from the coil wires.

The FOV refers to the region required to be covered by the RF coil. A large RF coil such as the body coil provides a large FOV coverage, but the MRI signals detected with such a coil have low SNR. By contrast, a small RF coil provides only a small FOV coverage but has a higher SNR.

A system offering both a higher SNR and larger FOV coverage is disclosed in U.S. Pat. No. 4,825,162 to Roemer. The Roemer patent teaches an RF coil construction for an MRI apparatus. The Roemer coil construction includes several single-loop coil elements arranged in a phased array to increase the FOV coverage and SNR of the images. The coil elements overlap each other and include tuning and matching capacitors.

The invention described in the Roemer patent has disadvantages. For example, the SNR of the RF coil construction in the Roemer patent is limited by the SNR of its individual coil elements. Consequently, there is a need in the art for an alternating system that further increases its SNR by increasing the SNR of its coil elements.

SUMMARY AND OBJECTS OF THE INVENTION

A first object of the present invention is to provide a new method of coil construction for use in MRI systems.

A second object of the present invention is to provide a cryogenically cooled RF coil to improve the signal-to-noise ratio over that detected by conventionally constructed coils.

A third object of the invention is to provide a cryogenically cooled phased array of RF coils to increase the field of view coverage over single cryogenically cooled coils.

These and other objects and features of the present invention are accomplished as embodied and fully described herein according to the invention, by the RF coil construction and arrangement discussed below.

The RF coil construction of the present invention includes a device for cryogenically cooling RF coils and at least two receiver coil elements cryogenically cooled by that device, and forming an array. Each coil element includes at least two capacitors for tuning and matching the coil. A circuit may be connected to each coil element to decouple that coil element from the transmitter coil(s), and to decouple that coil element from other coil elements.

With these and other objects, advantages and features of the invention that may become hereinafter apparent, the nature of the invention may be more clearly understood by reference to the following detailed description of the invention, the appended claims and the accompanying drawings.

BRIEF DESCRIPTION OF THE DRAWINGS

The preferred embodiments of this invention will be described in detail, with reference to the following figures, wherein.

DESCRIPTION OF THE INVENTION

Figure 1:
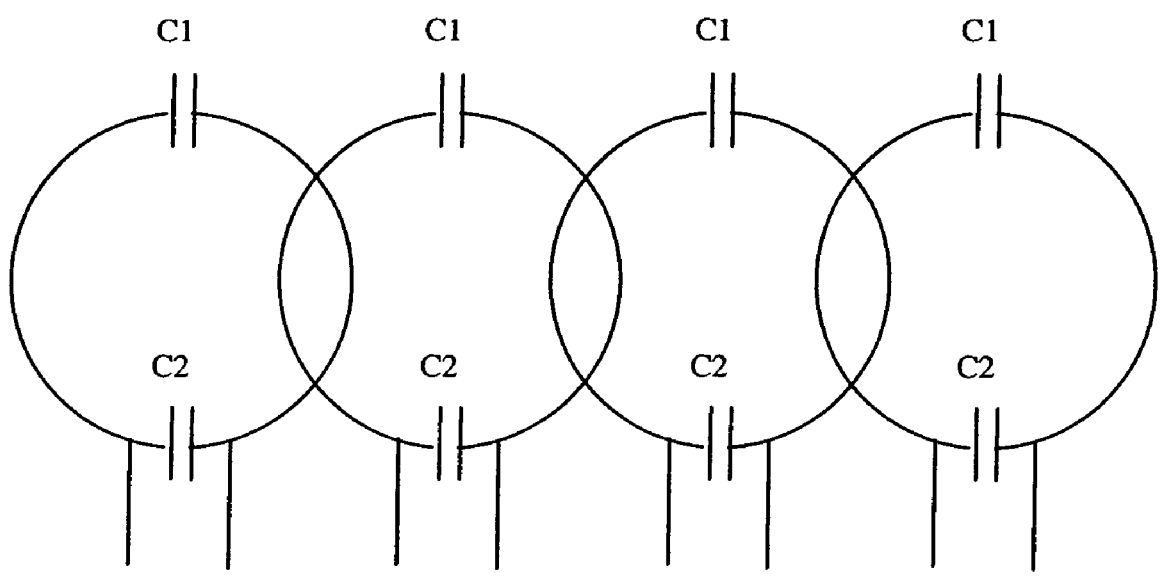
FIG. 1 illustrates a four-coil array according to one embodiment of the present invention.

The present invention includes the use of a cryogenically cooled RF coil structure that forms a phased array. The disclosed embodiments may be used to improve the image quality and to reduce the scan time in clinical high resolution MR imaging of musculoskeletal joints, such as wrist and fingers, as well as in high-resolution MR imaging of tissue specimens and small animals for biomedical research.

Cryogenically cooled RF receiver coils improve the SNR in MR imaging. See Wright A C, Song H K, Wehrli F W, In vivo MR micro imaging with conventional radiofrequency coils cooled to 77 degrees K. Magn Reson Med 2000; 43(2):163–169. The Wright paper, however, does not mention a cryogenic cooled phased array coil. In fact, the coil design in Wright is not compatible with phased array construction because it uses a separate resonant loop that inductively tunes and matches the receiver coil to the external preamplifier.

At magnetic fields of 1.0 Tesla or higher, cryogenically cooled single coils are limited to small sizes. For example, the largest dimension is in the order of centimeters (diameter for circular shape, length for rectangular). That size constraint in the coil limits the FOV coverage and thus the applications of the cryogenically cooled single coils. By using a novel design, the present invention enables phased array technology to be adapted to cryogenically cooled RF receiver coils, which results in the increase of FOV coverage for MR imaging.

For an example of phased array technology, see Roemer P B, Edelstein W A, Hayes C E, Souza S P, Mueller O M; The NMR phased array; Magn Reson Med 1990; 16(2): 192–225. That report does no mention combining the phased array design with the use of cryogenic cooled coil elements. Further, the decoupling circuit in that report may not be sufficient for use in cryogenic cooled phased arrays.

The novel design of the present invention may include a decoupling circuit to effectively reduce RF coupling between the RF transmit coil and the cryogenically cooled receiving phased array. That circuit also reduces the RF coupling among coil elements within the cryogenic phased array.

Prior to the present invention description, there are no known disclosures discussing the use of cryogenically cooled phased array RF receiver coils. Advantages of the present invention over cryogenically cooled single coils include the increase in FOV coverage, and the reduction in scan time by allowing parallel MR imaging to take place. Examples of parallel MR imaging are simultaneous acquisition of spatial harmonics (SMASH), discussed in Sodickson D K, Manning W J, Simultaneous acquisition of spatial harmonics (SMASH): fast imaging with radiofrequency coil arrays, Magn Reson Med 1997, 38(4):591–603; and sensitivity encoding (SENSE) for fast MRI, discussed in Pruessmann K P, Weiger M, Scheidegger M B, Boesiger P. SENSE: sensitivity encoding for fast MRI, Magn Reson Med 1999, 42(5):952–962. Those two articles describe the basics of MR parallel imaging and do not mention cryogenically cooled phased array RF coil design.

In one embodiment of the present invention, the phased array RF receiver coils are cryogenically cooled with liquid nitrogen ($LN_2$) at 1.5 Tesla. This can be done as described, for example, in two papers co-authored by the named inventors: Kwok W. E., You Z., Totterman S. M., Zhong J., In Vivo MR Imaging Using Liquid Nitrogen Cooled Phased Array RF Receiver Coil at 1.5 T, Proceedings of International Society of Magnetic Resonance in Medicine 10th Scientific Meeting and Exhibition, Honolulu, Hawaii 2002, p 879; and Kwok W. E., You Z., Zhong J., Improved high resolution imaging with 4-element liquid nitrogen phased array coil and VD-AUTO-SMASH at 1.5 T, Proceedings of International Society of Magnetic Resonance in Medicine 11th Scientific Meeting and Exhibition, Toronto, Canada 2003, p. 430.

The present invention may be extended and applied to the development of cryogenically cooled phased arrays using other cryogens, e.g., liquid helium, and other magnetic field strengths.

Two different $LN_2$ cooled phased arrays have been assembled and tested on phantoms, specimens, and normal volunteers. The results were compared with those of two similar phased arrays at room temperatures. The $LN_2$ cooled arrays have significant SNR improvement over the room temperature counterparts. Also, the SNR results in the MR images match well with the theoretical calculations using measured RF properties of the phased arrays.

The cryogenic cooling reduces the RF coil noise by lowering the coil resistance and the coil temperature. In theory, if the RF coil noise dominates the total noise, the SNR increases by a factor of 2.8 when cooled to $LN_2$ temperature. For example, $LN_2$ cooled RF coils at magnetic field strength of 1.5 Tesla may be able to obtain a SNR gain of 2.7 fold. Nevertheless, because sample noise increases with resonance frequency and coil size, coil sizes may be restricted to a few centimeters to keep the sample noise significantly lower than coil noise at field strengths of 1.0 Tesla or higher. That, however, may limit the FOV coverage and potential applications of $LN_2$ cooled coils.

In one embodiment of the present invention, identical linear phased arrays of either a dual or a four-coil array are separately tuned and matched at room temperature and $LN_2$ temperature (See FIG. 1). Individual coil elements in the phased arrays may be constructed from 14-gauge copper wire and formed into a rounded square shape (See FIG. 2). Neighboring coil elements overlap each other to reduce RF coupling. The size of the coil elements may be 3.3 cm.

Each phased array may be placed inside a plastic container that holds liquid nitrogen. A 2 mm thick styrofoam may be used to provide thermal insulation for the object scanned using the $LN_2$ cooled phased array (See FIG. 3).

Figure 3:
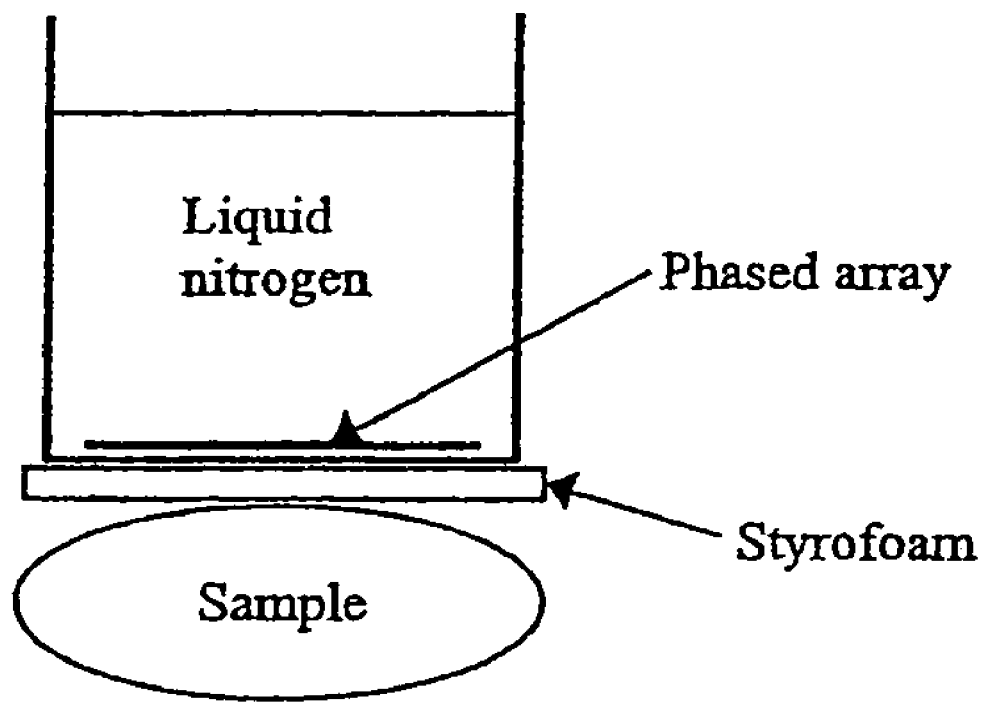
FIG. 3 illustrates a phased array setup for testing images according to one embodiment of the present invention.

FIG. 3 shows a phased array setup in imaging tests. The concept of the invention may be extended to other coil geometry, cryogenic container (dewar) and thermal insulation designs.

FIG. 1 is a sketch diagram of a linear phased array with four coil elements. Capacitors C1 and C2 are used for tuning and matching the RF coils. In general, a phased array can be made up of a number of coil elements and the coil elements can have a different orientation with respect to each other.

Figure 2:
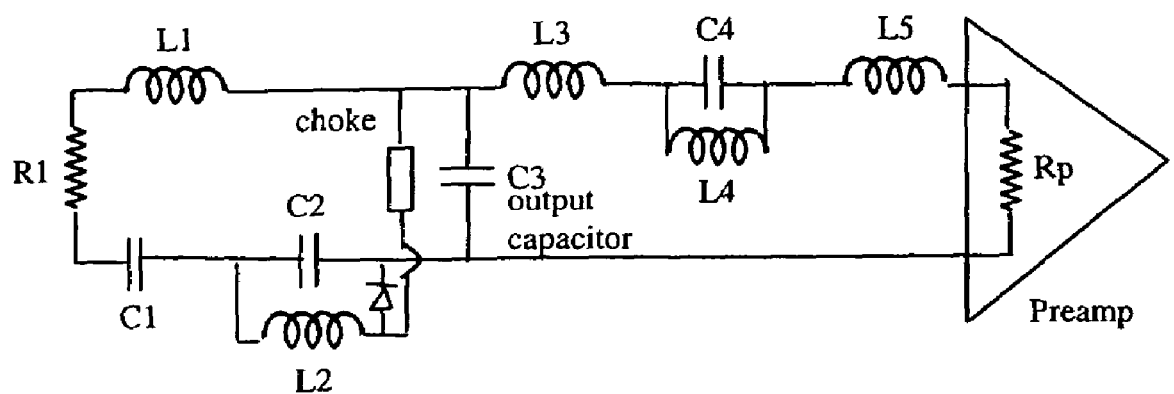
FIG. 2 illustrates a circuit diagram of a coil element in a phased array according to one embodiment of the present invention.

FIG. 2 is a circuit diagram of a coil element in the phased arrays. In the figure, L1, C1, C2, C3 and R1 represents the RF coils; L3 and C3 represents a conventional blocking circuit used in phased array coils; and L2 and C2 represent an additional blocking circuit which is activated during RF transmission. For tuning and matching of small $LN_2$ cooled RF coils, C3 is large and its corresponding impedance comparable to the receiver impedance Rp and L5. That reduces the decoupling power of the L3, C3 circuit. To improve coil decoupling, L4 and C4 are added to compensate for the receiver impedance L5. A second blocking circuit L2, C2 can also be added to reduce coupling between the transmit and the receive RF coils. Decoupling among coil elements and between coil elements and the transmit coil may also be achieved using some alternate circuit designs. One such design includes the use of a preamplifier with very low input impedance, $Rp<<X_{c3}$, where $X_{c3}$ is the reactance of C3. Another alternate decoupling design includes the use of an additional circuitry that replaces L4, C4 to compensate for both L5 and Rp, and to reduce the input impedance of the preamplifier to near zero. In both of these alternate designs, the blocking circuit L2, C2 may not be needed.

In vivo imaging studies were conducted by placing fingers under the phased array during scans. The separation between the phased arrays and the fingers may be set at around 8 mm.

For optimal parallel imaging SNR results, the $LN_2$ cooled phased array may potentially be redesigned with non-overlapping coil elements.

The system of the present invention has been tested. The quality factors of the dual phased array loaded with a thumb were measured as follows: $Q_{U300}$=175, $Q_{L300}$=175, $Q_{U77}$=303, and $Q_{L77}$=279, where $Q_{U300}$, $Q_{L300}$, $Q_{U77}$, and $Q_{L77}$ denote the unloaded and loaded Q factors at room temperature and LN2 temperature respectively.

Using the following equations for SNR gain in the $LN_2$ cooled coil, $$\frac{SNR_{77}}{SNR_{300}} = \sqrt{\frac{300 \cdot Q_{U300}^{-1} + 300 \cdot Q_{Sample}^{-1}}{77 \cdot Q_{U77}^{-1} + 300 \cdot Q_{Sample}^{-1}}} \quad \text{where } Q_{Sample}^{-1} = Q_{L77}^{-1} - Q_{U77}^{-1}$$

the calculated SNR gain for the dual phased array is 1.75, agreeing with the measured SNR gain of 1.72 in the imaging study.

While this invention has been described in conjunction with the specific embodiments outlined above, it is evident that many alternatives, modification and variations are apparent to those skilled in the art. Accordingly, the preferred embodiments of the invention as set forth above are intended to be illustrative and not limiting. Various changes may be made without departing from the spirit and scope of the invention.

We claim:

1. A circuit for decoupling at least one transmitter coil from the receiver coil elements comprising:
   - a receiver coil element comprising a receiver coil, a tuning capacitor, and an output capacitor;
   - an inductor and a diode electrically connected in series with each other and in parallel with the tuning capacitor; and
   - a choke connected at a first end between the inductor and the diode and at a second end so as to be in parallel with the output capacitor.

2. The circuit of claim 1, further comprising:
   - a first inductor electrically connected at a first end to the output capacitor;
   - a compensating circuit, connected in series to a second end of the first inductor, to compensate for a receiver impedance; and
   - a low input impedance preamplifier connected in series with the compensating circuit.

3. The circuit of claim 2, wherein the compensating circuit comprises a second inductor and a second capacitor connected in parallel to each other.

4. The circuit of claim 2, wherein the low input impedance preamplifier has an input impedance which is much smaller than a reactance of the output capacitor.

5. A circuit for decoupling among coil elements, the circuit comprising:
   - a receiver coil element comprising a receiver coil and an output capacitor;
   - a first inductor electrically connected at a first end to the output capacitor.
   - a compensating circuit, connected in a series to a second end of the first inductor, to compensate for a receiver impedance; and
   - a low input impedance preamplifier connected in series with the compensating circuit.

6. The circuit of claim 5, wherein the compensating circuit comprises a second inductor and a second capacitor connected in parallel to each other.

7. The circuit of claim 5, wherein the low input impedance preamplifier has an input impedance which is much smaller than a reactance of the output capacitor.

* * * * *